(12) United States Patent
Sugii et al.

(10) Patent No.: US 6,815,707 B2
(45) Date of Patent: Nov. 9, 2004

(54) FIELD-EFFECT TYPE SEMICONDUCTOR DEVICE FOR POWER AMPLIFIER

(75) Inventors: Nobuyuki Sugii, Tokyo (JP); Masatoshi Morikawa, Hanno (JP); Isao Yoshida, Hinode (JP); Katsuyoshi Washio, Tokorozawa (JP)

(73) Assignee: Renesas Technology Corp., Tokoyo (JP)

(*) Notice: Subject to any disclaimer, the term of this patent is extended or adjusted under 35 U.S.C. 154(b) by 0 days.

(21) Appl. No.: 10/259,396

(22) Filed: Sep. 30, 2002

(65) Prior Publication Data

US 2003/0062537 A1 Apr. 3, 2003

(51) Int. Cl.[7] ..................... H01L 29/04; H01L 31/0328
(52) U.S. Cl. ..................... 257/19; 257/18; 257/192
(58) Field of Search ................. 257/18–20, 190–195

(56) References Cited

U.S. PATENT DOCUMENTS

| | | | |
|---|---|---|---|
| 5,442,205 A | * | 8/1995 | Brasen et al. ............... 257/191 |
| 6,350,993 B1 | * | 2/2002 | Chu et al. ...................... 257/19 |
| 6,365,468 B1 | * | 4/2002 | Yeh et al. .................... 438/295 |
| 6,593,191 B2 | * | 7/2003 | Fitzgerald .................... 438/282 |
| 6,674,100 B2 | * | 1/2004 | Kubo et al. .................. 257/194 |

FOREIGN PATENT DOCUMENTS

| | | |
|---|---|---|
| JP | 4-196440 | 7/1992 |
| JP | 10-270685 | 10/1998 |

OTHER PUBLICATIONS

U.S. patent application Publication Ser. No. 2001/0003364A1, filed Jun. 14, 2001.
U.S. patent application Publication Ser. No. 2001/0012671A1, filed Aug. 9, 2001.
K. Yamamoto et al, "A 3.2–V Operation Single–Chip Dual–Band AlGaAs/GaAs HBT MMIC POwer Amplifier with Active Feedback Circuit Technique", IEEE Journal of Solid–State Circuits, vol. 35, No. 8, Aug. 2000, pp. 1109–1120.
Y. Hoshino et al, "High Performance Scaled Down Si LDMOSFET with Thin Gate Bird's Beak Technology", IEDM 99, 1999, pp. 205–208.
"Band Structure, Deformation Potentials, and Carrier Mobility in Strained Si, Ge, and SiGe Alloys", J. Appl. Phys., 80(4), Aug. 1996, pp. 2234–2252.

* cited by examiner

*Primary Examiner*—Ori Nadav
(74) *Attorney, Agent, or Firm*—Mattingly, Stanger & Malur, P.C.

(57) ABSTRACT

In a semiconductor multi-layer structure in which a first SiGe layer having a first conductivity-type and high impurity concentration, a second SiGe layer having the first conductivity-type and a low impurity concentration and a Si layer having a low impurity concentration are formed one on another in this order on a Si substrate of the first conductivity-type, a channel is formed in a part of the Si layer and a source electrode passes through the second SiGe layer of low impurity concentration to electrically contact the first SiGe layer of high impurity concentration or the substrate.

16 Claims, 8 Drawing Sheets

DISLOCATION

FIELD-EFFECT TYPE SEMICONDUCTOR DEVICE FOR POWER AMPLIFIER

BACKGROUND OF THE INVENTION

The present invention relates to field-effect type semiconductor devices and more particularly to a technique effectively applicable to a field-effect type semiconductor device for high-frequency power amplification of not less than 800 MHz used in a mobile communication unit.

With widespread use of a mobile communication terminal in recent years, a power amplifier for portable terminal of lower power consumption and higher efficiency has been demanded increasingly. For a power amplification device directed to this utilization, a transistor (HBT) using a compound semiconductor (HBT) or an insulated gate field-effect transistor (Si-MOSFET) using a silicon semiconductor (Si) has been used.

A power amplifier using the compound semiconductor is described in, for example, IEEE Journal of Solid-state Circuits, Volume:35 Issue:8, pp.1109–1120 (2000) (reference 1).

On the other hand, a power amplifier using the Si-MOSFET is detailed in, for example, IEDM99 Technical Digest (1999), pp.205–208 (reference 2) or US 2001/0012671 A1 (reference 3).

Incidentally, a phenomenon that the mobility can be increased by using strained Si or SiGe alloy is indicated in J. Appl. Phys. 80 (1996), pp. 2234–2252 (reference 4), for instance.

Further, a method of promoting the performance of a transistor (MOSFET) in an IC (specifically, CMOSIC) by using this phenomenon is disclosed in, for example, JP-A-10-270685 (reference 5) or US 2001/0003364 A1 (reference 6).

In the technique described in reference 5, for the purpose of obtaining characteristics of such high performance as having high transconductance in low voltage operation, an nMOS transistor and a pMOS transistor, each having a LDD structure, are formed in a silicon layer in which strain is applied (the so-called strained Si layer).

Also, in the technique described in reference 6, for the purpose of obtaining a complementary field-effect transistor capable of operating at a high speed and reducing power consumption, an nMOS transistor is formed in a strained silicon layer and a pMOS transistor is formed in a strained silicon/germanium layer.

SUMMARY OF THE INVENTION

The application of the compound semiconductor has raised a problem of an expensive unit price of wafer.

On the other hand, when the silicon semiconductor (Si) disclosed in reference 3 is applied, the wafer unit price is cheaper than that in the case of the compound semiconductor. In addition, the existing Si process technology can be applied to advantage.

However, because of a limited property of matter of Si, the efficiency can only be increased limitedly. More specifically, for promotion of the performance of the Si-MOSFET, decreasing the gate oxide film thickness and shortening the channel length have hitherto been effective but such scaling as above has not at last be connected directly to the performance promotion. In other words, the more the scaling advances, the more the effective mobility in the channel decreases. This is because a strong electric field is applied to an interface to the gate oxide film and consequently, the carrier density increases and scattering of carriers are accelerated. As a result, carriers are pressed against the interface to the gate oxide film, and scattering of carriers increases to decrease the carrier mobility. Accordingly, the channel conductance having control of the performance of the Si-MOSFET can be decreased only limitedly.

In order to improve the effective mobility, control of impurity profile responsible for relaxing the electric field in the channel, for example, is conceivable but owing to the limited threshold voltage and a limited decrease in the power supply voltage (at present, 3.5V of lithium battery), especially, in the case of a high-frequency power MOSFET, the expedient as above has failed to play an eminent role in performance improvement.

The present inventors have studied the techniques disclosed in the aforementioned references 5 and 6 from the viewpoint of means for improving the effective mobility.

The techniques disclosed in the references 5 and 6 are directed to transistors of low voltage/low power that are practiced in complementary field-effect transistors (CMOSFET's) constituting a logic circuit. In the CMOSFET's, SiGe alloy and strained Si of the same conductivity-type are formed on an ordinary Si substrate (having a resistivity of the order of about one ohm·cm) so as to be practiced at sufficiently low supply voltages.

However, it has been clarified by the present inventors that when the SiGe alloy and strained Si disclosed in references 5 and 6 are simply used in the channel portion in the high-frequency power MOSFET described in reference 3, promotion of the performance of the high-frequency power amplification MOSFET required of high drain breakdown voltage cannot be attained.

More specifically, the application of the SiGe alloy layer onto the low-resistance substrate ($P^+$-type substrate) with a view to improving the carrier mobility in the channel portion in the high-frequency power MOSFET described in reference 3 is equivalent to an idea of epitaxially growing high-resistance SiGe ($P^-$ SiGe) on the $P^+$-type substrate. In case SiGe having a lattice constant different from that of the substrate is grown on the Si substrate, a region containing a large quantity of crystal defects is always formed near the interface between the SiGe layer and the Si substrate. Namely, if a high-frequency power MOSFET is fabricated by using the substrate containing the SiGe layer and the strained Si, a depletion layer present in the $P^-$-SiGe layer is liable to extend, so that the depletion layer reaches the crystal defect region and leakage current tends to occur between the drain and source. The leakage current in the crystal defect region causes the power consumption to increase and the breakdown voltage to decrease, thus making it difficult to improve the performance of the high-frequency power MOSFET.

It is an object of the invention to provide a technique of improving the transconductance while assuring breakdown voltage in a high-frequency power semiconductor device.

Another object of the invention is to provide a technique of reducing size and weight of a high-frequency power amplifier.

The above and other objects and novel features of the present invention will become apparent taken in conjunction with a description of the present specification and the accompanying drawings.

According to one aspect of the invention, a field-effect type semiconductor device for power amplification comprises a semiconductor multi-layer structure in which a first SiGe layer having a first conductivity-type and relatively high impurity concentration, a second SiGe layer having the first conductivity-type and relatively low impurity concentration and a Si layer having the first conductivity type and relatively low impurity concentration are sequentially formed on one major surface of a Si substrate having the first conductivity-type, wherein a gate electrode is formed on a major surface of the semiconductor multi-layer structure through a gate insulating film, a source region and a drain region each having a second conductivity-type are so formed in the second SiGe layer as to sandwich the Si layer underlying the gate electrode and serving as a channel forming region, and a reach-through layer electrically connected to the source region is so formed as to pass through the second SiGe layer and reach the first SiGe layer.

With the above construction, the region containing a large quantity of crystal defects (dislocation) caused by bonding different lattice sizes is so conditioned as to be confined in the first SiGe layer of relatively high impurity concentration. The depletion layer extending from the drain region sufficiently expands until the first SiGe layer of relatively low impurity concentration and when it comes to the first SiGe layer of high impurity concentration, its expansion is suppressed. Therefore, the depletion layer will not expand to the region containing the large quantity of crystal defects (dislocation). Accordingly, the depletion layer expansion limited to the second SiGe layer (low-concentration layer) can assure the drain breakdown voltage and the suppression of the depletion layer expansion at the first SiGe layer (high-concentration layer) can reduce the leakage current. In addition, the strained Si having tensile strain is formed on the surface of the second SiGe layer and this strained Si is used as the channel region, with the result that the band structure is changed by the strain and the carrier mobility can be improved by about 70% as compared to that with unstrained Si. Accordingly, the transcopnductance can be improved and a power semiconductor device of high performance can be provided.

Other objects, features and advantages of the invention will become apparent from the following description of the embodiments of the invention taken in conjunction with the accompanying drawings.

DESCRIPTION OF THE EMBODIMENTS

The present invention will now be described by way of example with reference to the accompanying drawings.

Embodiment 1

In the present embodiment, an N-channel field-effect type semiconductor device is exemplified in which a channel is formed in a Si layer formed on a SiGe layer.

Figure 1:
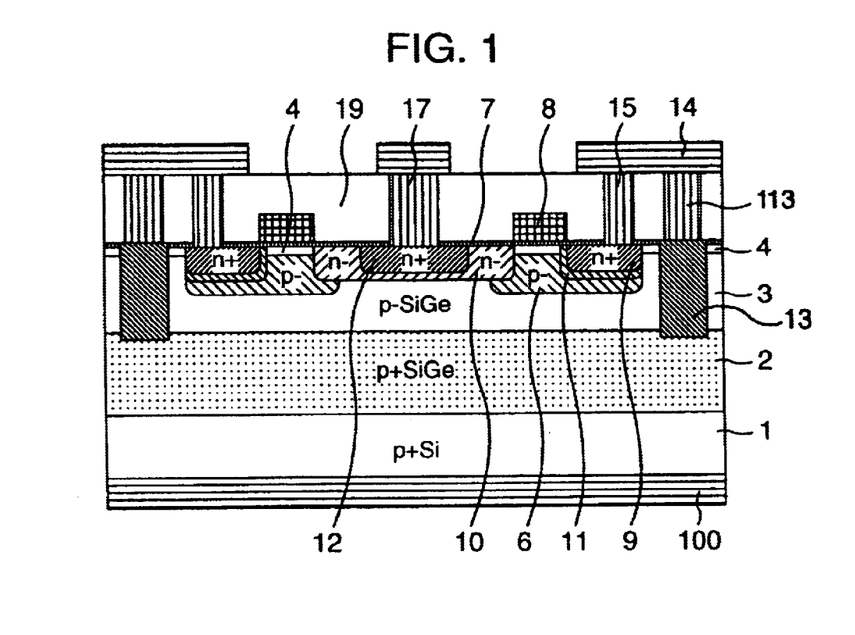
FIG. 1 is a longitudinal sectional view showing essential part of an N-channel field-effect type semiconductor device according to embodiment 1 of the invention.
Figure 2:
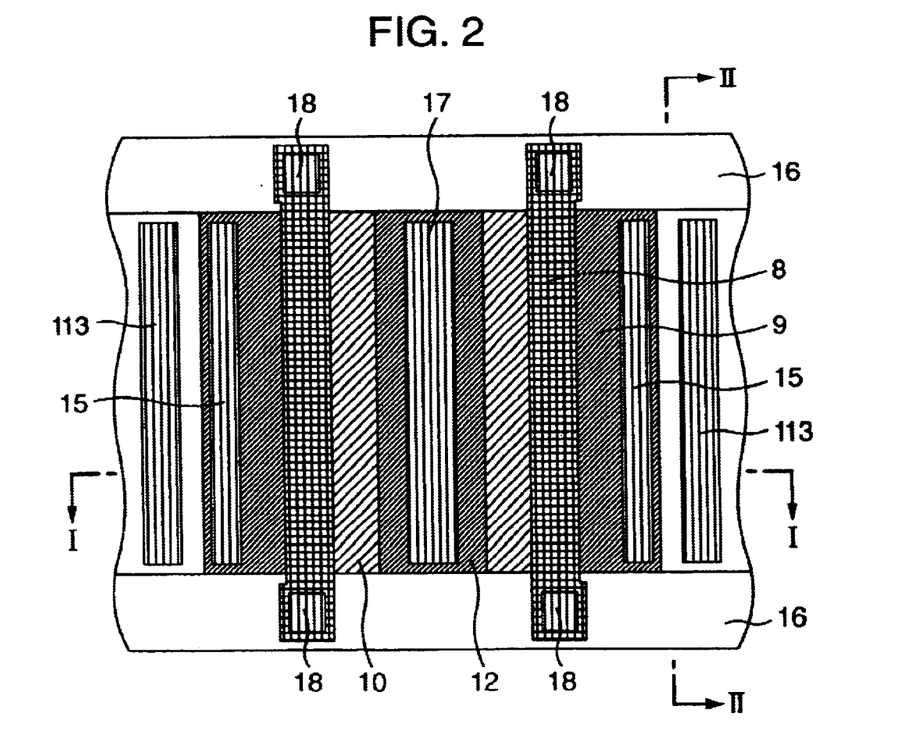
FIG. 2 is a plan view of essential part of the N-channel field-effect type semiconductor device in embodiment 1 of the invention.

FIG. 1 is a longitudinal sectional view of essential part of an N-channel field-effect type semiconductor device according to the present embodiment and FIG. 2 is a plan view of the N-channel field-effect type semiconductor device. Specifically, the FIG. 1 sectional view shows a section taken on line I—I in FIG. 2. Prior to giving a description with reference to FIGS. 1 and 2, a semiconductor multi-layer structure used in the fabrication of the field-effect semiconductor device of embodiment 1 will be described by making reference to FIGS. 3 and 4.

Figure 3:
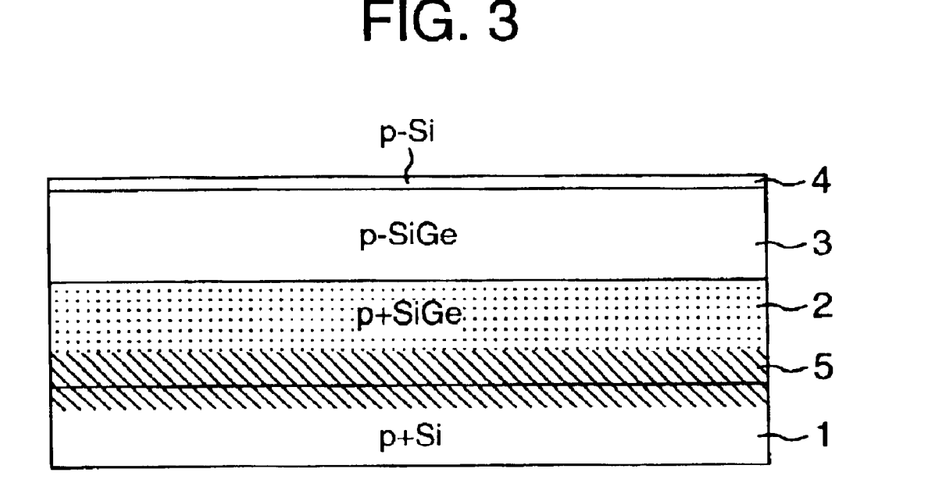
FIG. 3 is a longitudinal sectional view showing a semiconductor multi-layer structure in embodiment 1 of the invention.

As shown in FIG. 3, in the semiconductor multi-layer structure used in the fabrication of the field-effect type semiconductor device according to embodiment 1, a P-type low-resistance first SiGe layer 2, a P-type high-resistance second SiGe layer 3 and a P-type high-resistance Si layer 4 are formed sequentially in this order on a P-type low-resistance Si substrate 1. The Si substrate 1 has a resistivity of 0.01 Ωcm. The Si substrate 1 is chemically washed and thereafter admitted to a low-pressure chemical vapor deposition (LPCVD) equipment to grow the first SiGe layer 2. As a raw material gas, $SiH_4$ and $GeH_4$ diluted with $H_2$ gas is used and the growth temperature is set to 650° C. Further, to let the layer 2 have a conductivity type of P, a suitable quantity of $B_2H_6$ is added to the raw material gas to permit the first SiGe layer 2 to have an impurity concentration of not less than $1 \times 10^{19}/cm^3$. The layer 2 has a film thickness of 2.0 μm. The flow rate of the raw material gas is controlled in such a way that the Ge content ratio starts increasing at the time of commencement of growth and continues to increase at a constant rate until the film thickness comes to 1.5 μm and thereafter the Ge content ratio becomes constant, amounting up to 30%. In this manner, the P-type low-resistance first SiGe layer 2 is formed on the top of the Si substrate 1.

Next, the interior of the LPCVD unit is cleaned to decrease a partial pressure of residual $B_2H_6$ gas partial pressure inside the LPCVD unit and then, the second SiGe layer is caused to 1.0 μm grow. Growth conditions are similar to those for the first SiGe layer 2 in that the partial pressure of the raw material gas is changed to permit the Ge content ratio to amount to a constant value of 30% and to permit the impurity concentration to amount to about $5 \times 10^{16}/cm^3$.

Subsequently, the supply of $GeH_4$ gas is stopped to grow the P-type high-resistance Si layer 4 by a thickness of 30 nm. The Si layer 4 has an impurity concentration similar to that of the second SiGe layer 3. It is to be noted that part of the Si layer 4 gradually disappears during the steps of washing and oxidation in the transistor fabrication process and as a result, the Si layer 4 in a channel region of a completed field-effect transistor has a thickness of about 20 nm.

A longitudinal section of a semiconductor multi-layer structure fabricated through the above process was observed with a transmission electron microscope. As hatched in FIG. 3, dislocation loops were observed over a region of 500 nm upper thickness and 500 nm lower thickness centered on an interface between the Si substrate 1 and the first SiGe layer 2. It was confirmed that this high defect-density region, designated at reference numeral 5, does not at all come into contact with the overlying second SiGe layer 3 and Si layer 4. The schematical drawing of atomic bonding state in the semiconductor multi-layer structure as above is shown in FIG. 4.

Figure 4:
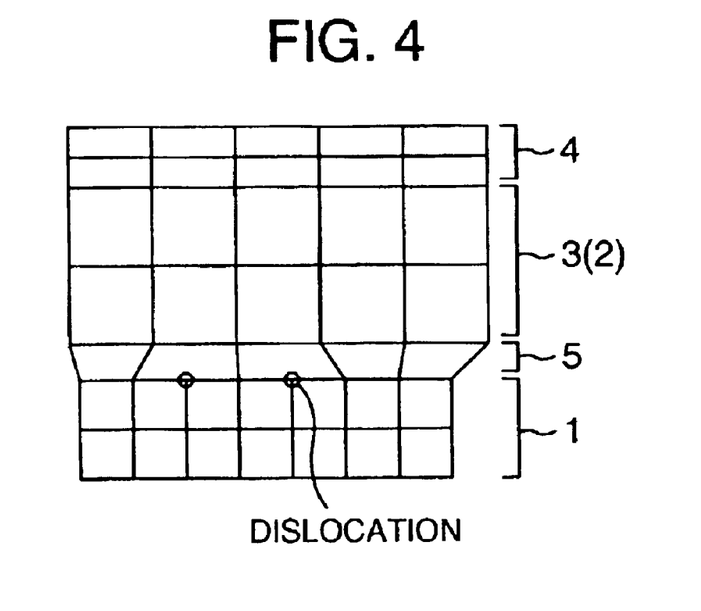
FIG. 4 is a diagram showing a model of lattice arrangement in the semiconductor multi-layer structure in embodiment 1 of the invention.

As shown in FIG. 4, in a multi-layer structure of the Si substrate 1 and first SiGe layer 2 having different lattice constants, respectively, the lattice is expanded by generating dislocation at and/or near the interface 5. Then, the Si (strained Si) 4 containing tensile strain can be obtained on the second SiGe layer 3 in alignment with the lattice of crystal of the second SiGe layer 2. An unstrained crystalline lattice such as the Si substrate 1 is of a cubic system but the crystalline lattice of the strained Si 4 is tensioned laterally to exhibit a tetragonal system.

Now, the field-effect semiconductor device comprised of the semiconductor multi-layer structure fabricated through the process described as above is structured as will be described below.

As shown in FIG. 1, a P-type well region 6 is formed in part of the major surfaces of P-type high resistance second SiGe layer 3 and P-type high resistance Si layer 4. A gate electrode 8 is formed above the P-type well region 6 through a gate insulating film 7. In this manner, a channel is formed near an interface to gate insulating film 7 that underlies the gate electrode 8 and exists in the Si layer 4.

Also, an N-type source region 9 and an N-type drain offset region 10 being lower in impurity concentration than the N-type source region 9 are formed in the P-type high-resistance second SiGe layer 3 and in part of the major surface of P-type high-resistance Si layer 4, and a pocket punch-through stopper 11 is formed between the N-type source region 9 and the P-type well region, each of the regions 9 and 10 and pocket punch-thorough stopper 11 being formed in self-alignment with the gate electrode 8. An N-type drain region 12 of high impurity concentration adjoins the N-type drain offset region 10.

A substrate contact region 13 is so formed as to pass through the P-type high resistance second SiGe layer 3, P-type high-resistance Si layer 4 and gate insulating film 7. The substrate contact region 13 electrically connects to the N-type source region through a first wire layer 14 formed on an inter-layer insulating film 19 and a source contact plug 15.

As shown in FIG. 2, the width of channel region in the device (that is, the channel width) is prescribed by a distance between device isolation regions 16. Although not depicted in FIG. 3, a drain contact plug 17 connected to the N-type drain region 12 and a gate contact plug 18 that connects to the gate electrode 8 on the device isolation region 16 are each connected electrically to the first wire layer 14 (see FIG. 1) or a wire layer overlying the layer 14.

Figure 5:
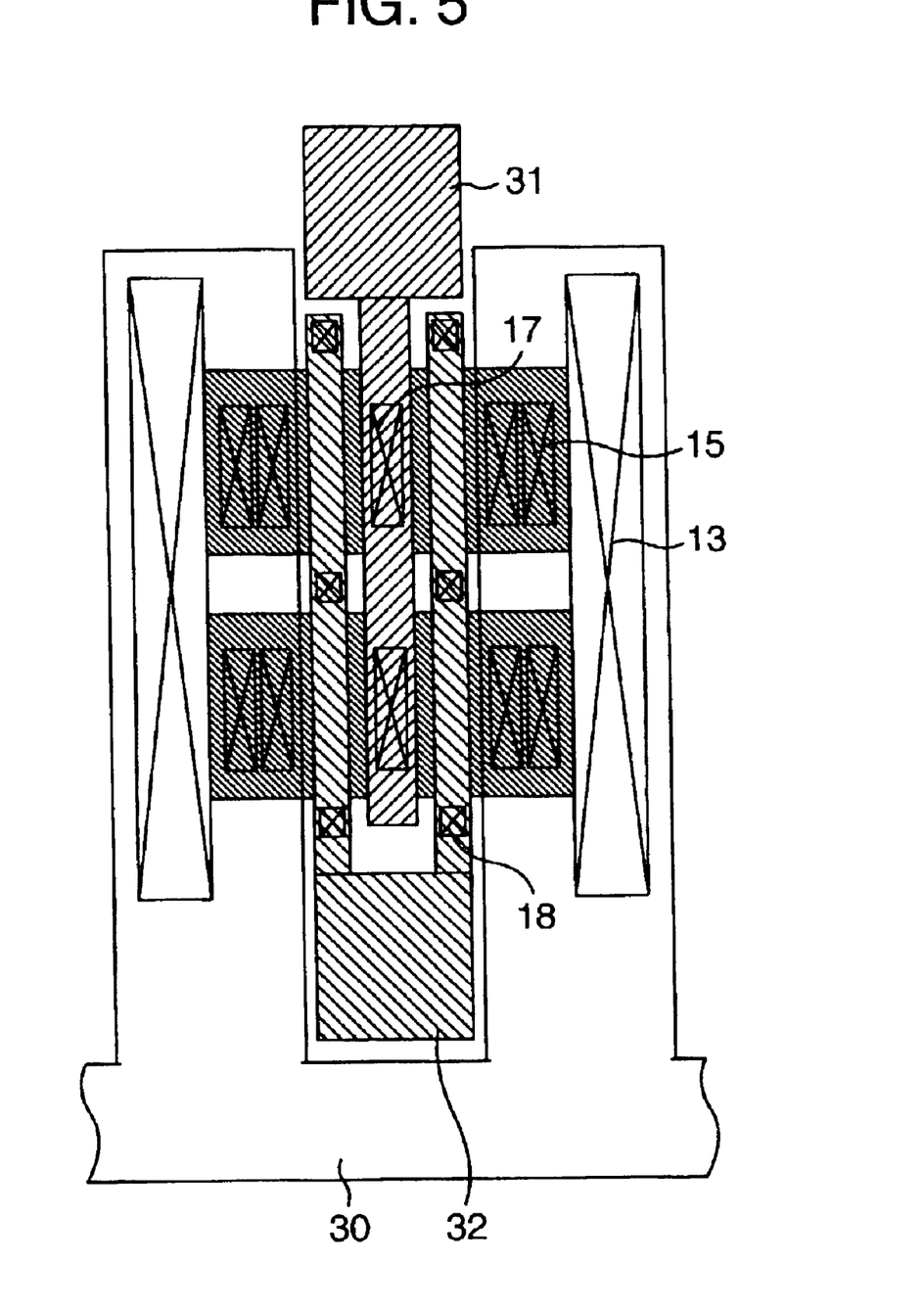
FIG. 5 is a plan view of essential part of the N-channel field-effect type semiconductor device in embodiment 1 of the invention.

Referring now to FIG. 5 being a plan view showing a wire portion of the FIG. 2 device, the layout of source electrode and source grounding portion will be described. In this case, two devices of FIG. 2 are juxtaposed. The drain contact plugs 17 and a drain wire 31 are provided in the center, and the gate contact plugs 18 and a gate wire that take the form of a tuning fork are arranged on both sides of the central components. In the source regions on both sides of the tuning fork arrangement, the source contact plugs 15 and the substrate contact region are formed and they are interconnected by a source wire 30.

Figure 6:
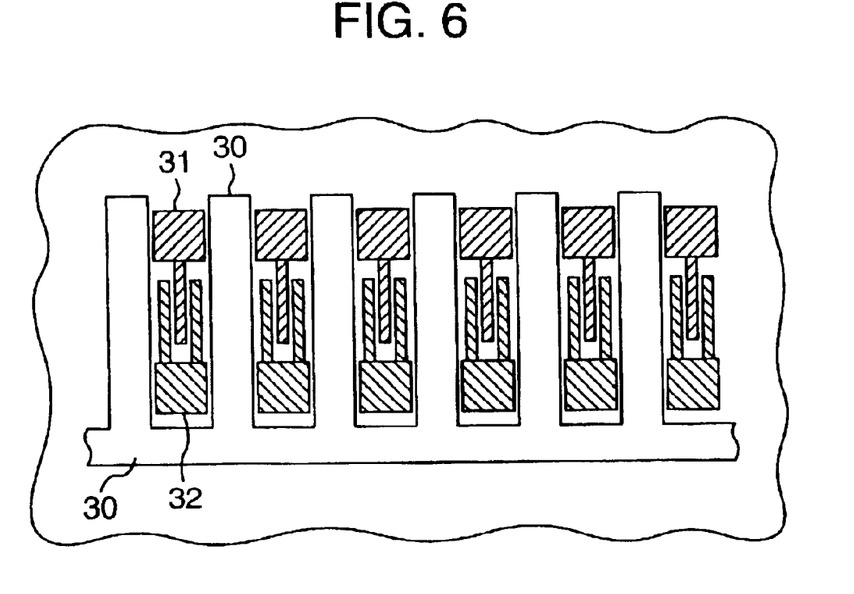
FIG. 6 is a plan view of a main part of the N-channel field-effect type semiconductor device in embodiment 1 of the invention.

Wiring set up when a plurality of the FIG. 5 devices are arrayed are illustrated in a plan view of FIG. 6. The drain, source and gate are interdigitated alternately to provide a parallel connection of many devices. Further, in a region of source wire 30 between the individual devices, the substrate contact region is formed to provide a structure that reduces the grounding resistance.

Figure 7A:
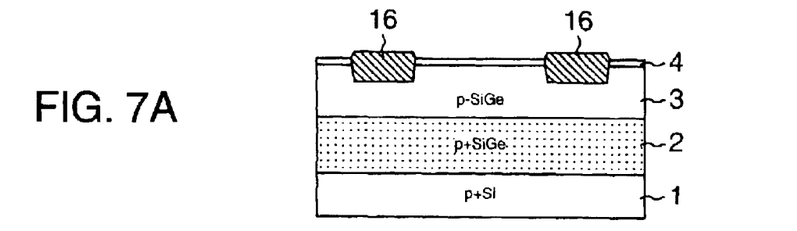
FIGS. 7A to 7H are sectional diagrams for explaining fabrication steps of the N-channel field-effect type semiconductor device in embodiment 1 of the invention.
Figure 7B:
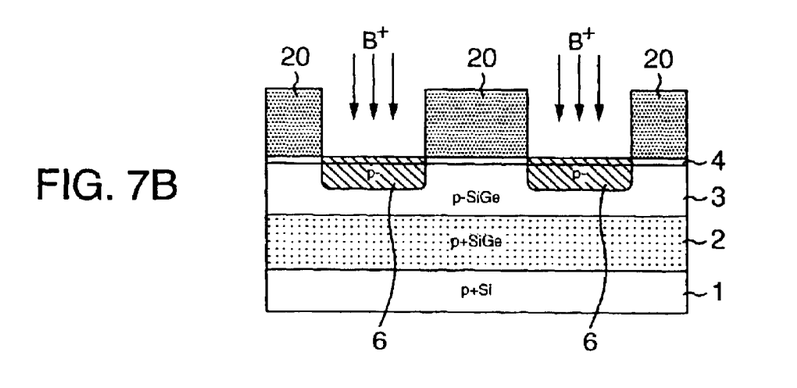

A fabrication process of the field-effect type semiconductor device having the above structure will be described hereunder with reference to FIGS. 7A to 7H. Only FIG. 7A shows a section as viewed in a direction orthogonal to FIG. 2, that is, in II—II direction shown in FIG. 2. FIG. 7B and ensuing figures show sections as viewed in the same direction as that for FIG. 1, that is, in I—I direction shown in FIG. 2.

Firstly, a semiconductor wafer of the semiconductor multi-layer structure shown in FIG. 1 is prepared. Then, as shown in FIG. 7A, device isolation regions 16 are formed. For formation of the device isolation regions 16, a shallow groove isolation method is employed, according to which grooves having a depth of 300 nm are formed through photo-process, dry-etching process and chemical-mechanical polishing process and insulating films are embedded in the grooves.

Next, as shown in FIG. 7B, B (boron) ions are doped or implanted by about $5 \times 10^{12}/cm^2$ at 50 keV energy by using photoresist 20 as a mask to form P-type well regions 6. Annealing after the ion implantation is carried out at 950° C. for 30 seconds through rapid thermal annealing (RTA).

Figure 7C:
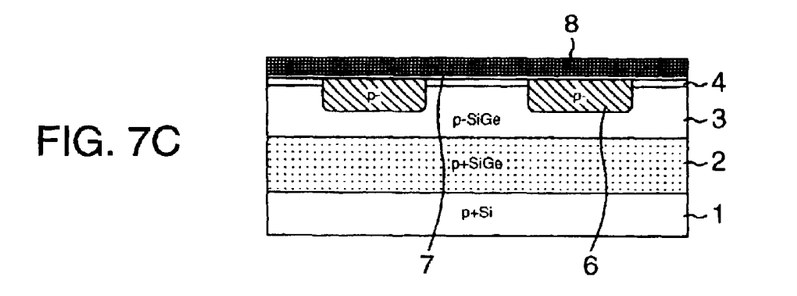

As shown in FIG. 7C, the Si layer 4 is then treated by oxidizing and nitriding to form a gate insulating film 7 of 8 nm thickness and P (phosphorus) ions are doped by about $5 \times 10^{20}/cm^3$ through CVD to form a gate electrode film 8 comprised of a polycrystalline Si film having a thickness of 100 nm. The gate electrode film is patterned to provide a gate length of 0.18 µm through lithography based on KrF excimer laser stepper. After the gate patterning, the neighbor of the gate is further oxidized slightly by about 5 nm to form gate bird's beaks.

Figure 7D:
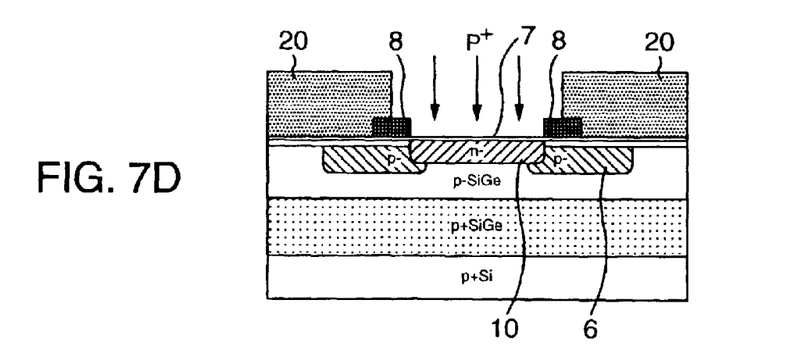
Figure 7E:
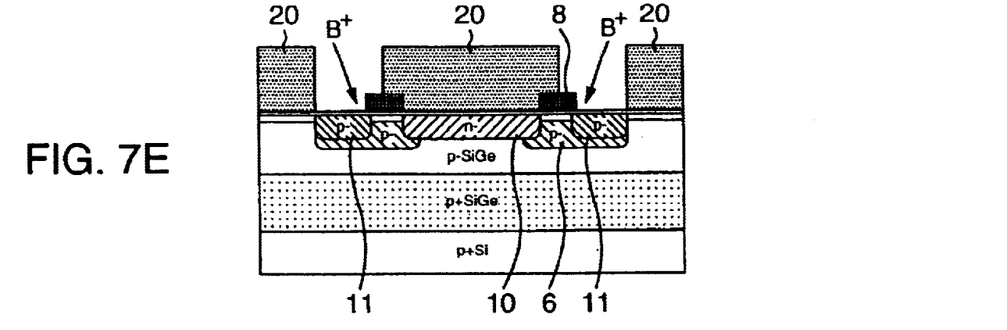
Figure 7F:
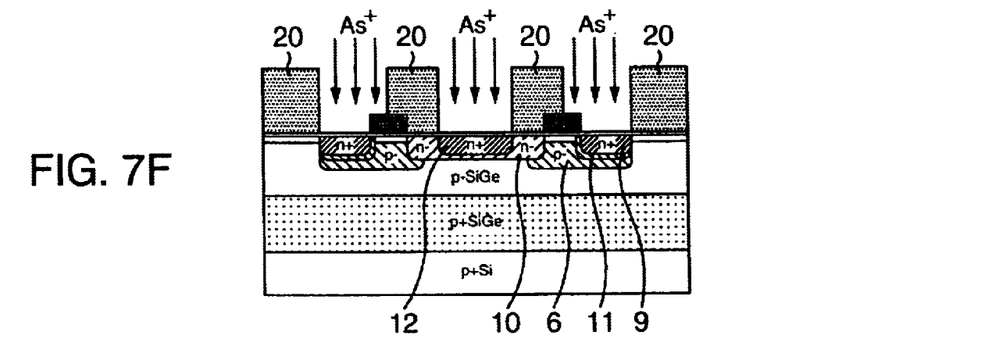

Further, as shown in FIG. 7D, P (phosphorus) ions are implanted by about $2 \times 10^{13}/cm^2$ at 40 KeV energy by using photoresist 20 and gate electrode 8 as a mask to form an N-type drain offset region 10. Then, as shown in FIG. 7E, B (boron) ions are implanted by about $5 \times 10^{14}/cm^2$ at 25 KeV energy to form a pocket punch-through stopper 11 positioned in the P-type well region 6 and in addition, as shown in FIG. 7F, As (arsenic) ions are implanted by about $6 \times 10^{15}/cm^2$ at 50 KeV energy to form an N-type source region 9 and an N-type drain region 12.

Figure 7G:
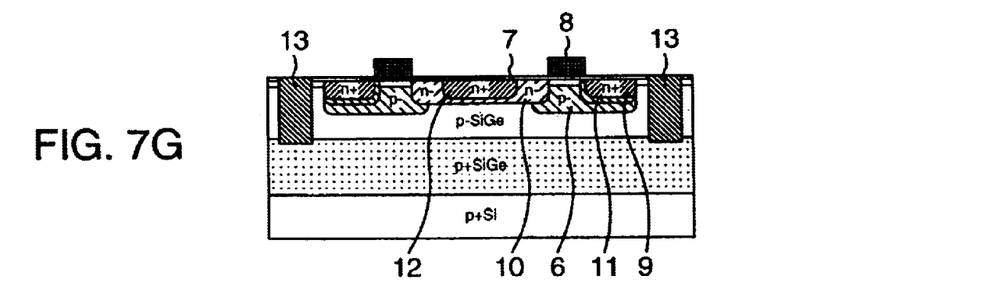

Thereafter, as shown in FIG. 7G, part of the semiconductor multi-layer structure is so opened, through photolithography and dry-etching, as to pass through the second Si Ge layer 3 and reach the first SiGe layer 2 and bottom portions of substrate contact regions 13 each having a two-layer structure of Wsi (tungsten silicide) and W (tungsten) are embedded. At the same time, the top of the gate electrode film 8 is also turned into silicide.

Figure 7H:
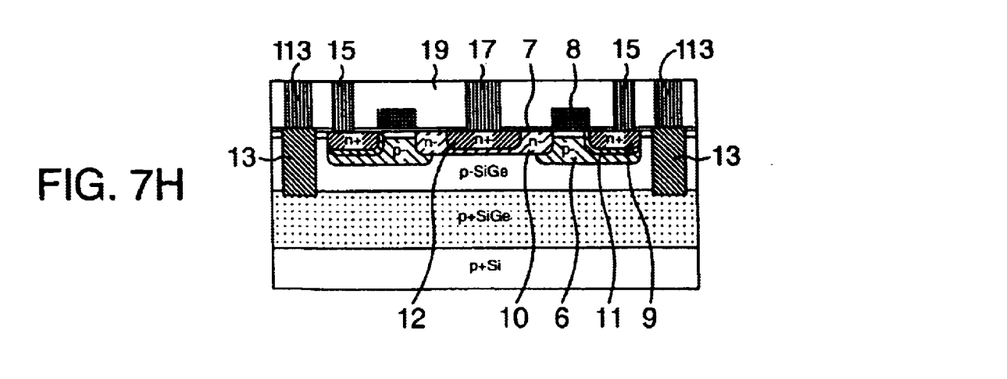

Next, as shown in FIG. 7H, an inter-layer insulating film 19 is formed through $O_3$-TEOS and part of the film 19 is opened through photolithography and dry-etching and W is embedded in openings to form contact plugs 15, 17 and 18 (18 is not shown) of the source, drain and gate and additional upper portions 113 of the substrate contact regions 13.

Further, a first wire layer 14 is formed of a double-layered film of Al and TiN. Although not illustrated, on the first wire layer 14, a second wire layer is formed through an interlayer insulating film similar to the inter-layer insulating film 19. On the other hand, a source electrode 100 is formed on the bottom of the substrate 1. The source electrode 100 is formed by sequentially laminating a layer of nickel (N), a layer of titanium (Ti), a layer of nickel (Ni) and a layer of silver (Ag) of good soldering properties.

In the present transistor, the electron mobility in the Si layer (strained Si) 4 is advantageously increased by 70% as compared to that in the ordinary Si field-effect transistor, with the result that the transconductance is improved by 50% as compared to that of the conventional transistor to improve the power added efficiency (PAE) of power amplifier circuit by 40%.

Embodiment 2

In the present embodiment, there is exemplified a P-channel field-effect type semiconductor device in which a channel is formed in a Si layer formed on a SiGe layer. The fabrication process extremely resembles that in the case of embodiment 1 and only different points will be described.

The semiconductor multi-layer structure shown in FIG. 3 is structurally altered in the present embodiment to have an N-type low resistance Si substrate 1, an N-type low resistance first SiGe layer 2, an N-type high resistance second SiGe layer 3 and an N-type high resistance Si layer 4. As a doping gas, $PH_3$ is used in place of the $B_2H_6$ and the impurity concentration is similar to that in embodiment 1.

The well region 6 and punch-through stopper 11 are of N-type and for them, P is implanted in place of B. Each of the source region 9, drain region 12 and drain offset region 10 is of P-type and for its formation, B or $BF_2$ is implanted. The ion implantation depth and implantation quantity are similar to those in embodiment 1. The polycrystalline Si film of gate electrode is of P-type and so B is doped for its formation.

In the present transistor, the hole mobility in the Si layer 4 is increased advantageously by 85% as compared to that of the ordinary Si field-effect transistor, and as a result, the transconductance is improved by 70% as compared to that of the conventional transistor to improve the power added efficiency of power amplifier circuit by 60%.

Embodiment 3

In the present embodiment, a P-channel field-effect type semiconductor device will be exemplified in which a channel is formed near an interface to Si layer 4 inside the second SiGe layer 3. The fabrication process extremely resembles that in embodiment 2 and only different points will be described.

When, in the foregoing semiconductor multi-layer structure, the thickness of Si layer 4 is set to 15 nm, the thickness of the Si layer 4 in a channel region of a completed field-effect transistor is less than 5 nm and as a result, the channel is not formed in the Si layer 4 but is formed near an interface to Si layer 4 inside the second SiGe layer 3.

In the present transistor the hole mobility in the second SiGe layer 3 is 2.1 times increased to advantage as compared to that of the ordinary Si field-effect transistor and the transconductance is improved by 90% as compared to the conventional transistor to 75% improve the power added efficiency of power amplifier circuit.

Embodiment 4

Figure 8:
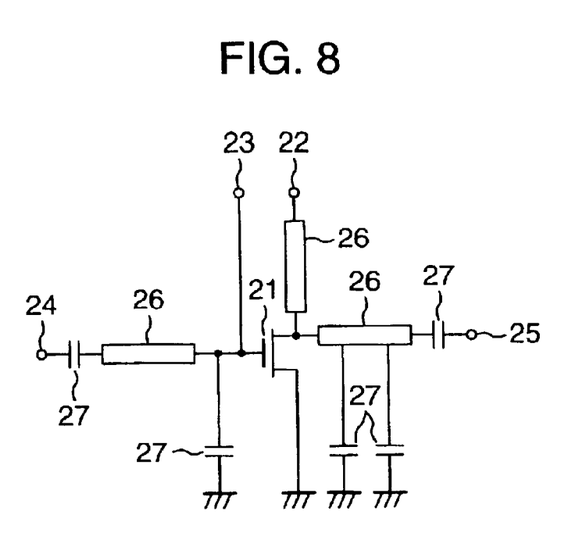
FIG. 8 is a circuit diagram of power amplifier according to embodiment 4 of the invention.

Referring to FIG. 8, there is illustrated a circuit diagram of a power amplifier final stage according to the present embodiment. Constructed in FIG. 8 is an output circuit of single end using an N-type transistor 21 only. The N-type transistor 21 is structured as has been explained in connection with embodiment 1.

The transistor has a source grounded and a drain connected to a positive power supply 22 through a strip line 26 acting as a load. Its gate is applied with a bias voltage from a bias power supply 23. A signal is applied from an input port 24, coming to the gate via a capacitor 27 and a strip line 26. An output on the drain side is routed through an output matching circuit comprised of a strip line 26 and a capacitor 27 so as to be delivered out of an output port 25.

Embodiment 5

Figure 9:
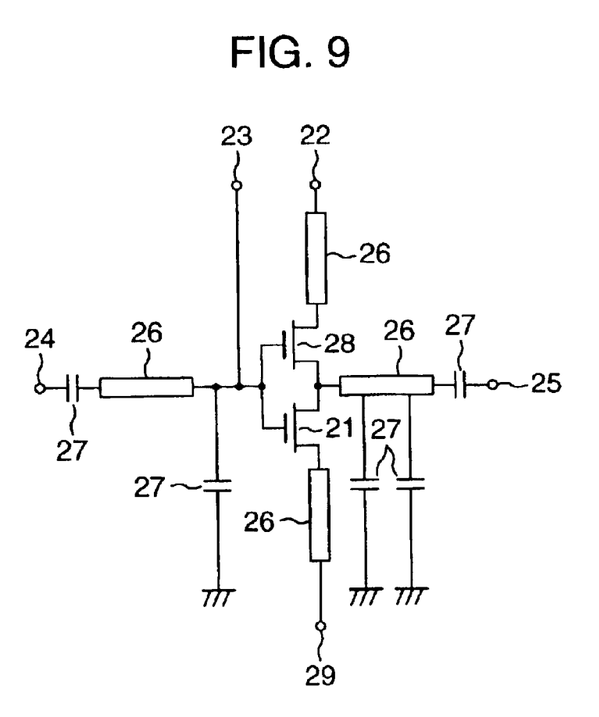
FIG. 9 is a circuit diagram of power amplifier according to embodiment 5 of the invention.

Referring to FIG. 9, there is illustrated a circuit diagram of the present embodiment. An N-type transistor 21 similar to that in embodiment 1 and a P-type transistor 28 fabricated through a method similar to that for embodiment 2 have their drains connected to each other, the P-type transistor has its source connected to a positive power supply 22 through a strip line 26 acting as a load and the N-type transistor has its source connected to a negative power supply 29 through a strip line 26 acting as a load, thus forming a complementary circuit. Drain potential of the two transistors and potential of a bias power supply 23 are equal to ground potential. Circuits on the input and output sides are similar to those in FIG. 8.

According to the present embodiment, the negative power supply is needed in comparison with the case of embodiment 4 but power supply voltages of these power supplies can each be 40% to provide the same output and therefore the linearity of the amplifier device can be excellent to halve distortion in the output waveform as compared to that in the case of the single N-type transistor.

Further, the breakdown voltage can have a margin and for the same power supply voltage as that in the case of the single N-type transistor, the output can be 7 times improved.

If the circuit is to be operated with a single power supply, a portion of the negative power supply 29 is grounded to make the potential of the bias power supply 23 half the drain voltage of the two transistors, that is, half the potential of the positive power supply 22. But in case the operating points of the P-type and N-type transistors are set asymmetrically for the purpose of improving the linearity, the above is not applicable. Even when the above structure is adopted with the use of a single power supply, performance similar to that obtained with the positive and negative power supplies can be obtained.

In the present embodiment, the drains are mutually connected but obviously, the sources may similarly be connected to each other.

Embodiment 6

Figure 10:
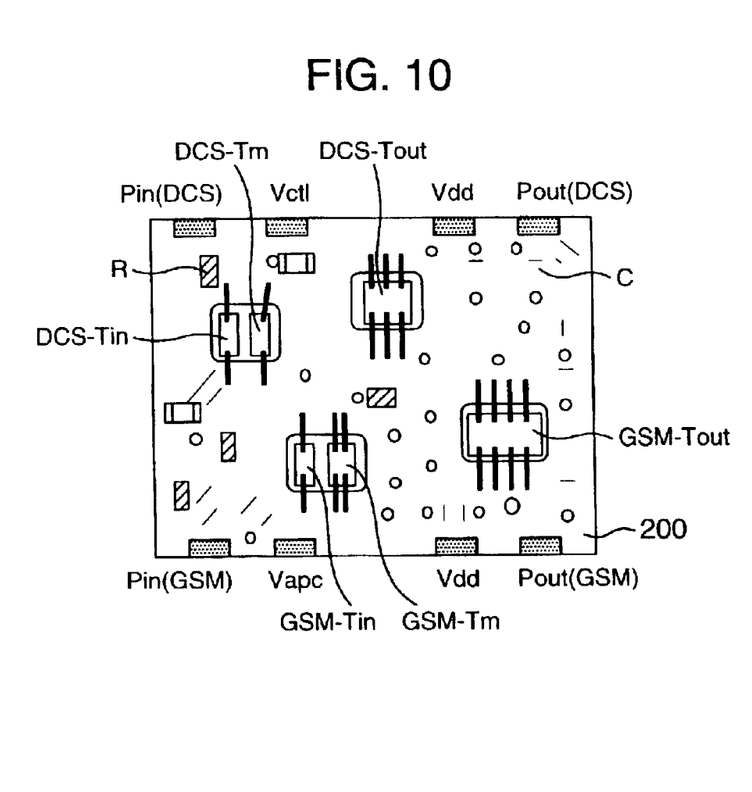
FIG. 10 is a plan view of a power module in embodiment 5 of the invention.

Referring now to FIG. 10, there is illustrated, in plan view form, a power module using the transistor of embodiment 1.

The module shown in FIG. 10 complies with a dual band of GSM (Global System for Mobile Communications) and DCS (Digital Cellular System).

A module substrate 200 formed with multi-layer wiring is mounted, by soldering, with a first stage transistor DCS-Tin for DCS and an intermediate stage transistor DCS-Tm for DCS that serves as a DCS driver stage (two stages) and an output stage transistor DCS-Tout for DCS serving as a DSC output stage. Then, the individual transistors are electrically connected to predetermined wiring lines by wiring conductors. In addition, the substrate is also mounted, by soldering, with a first stage transistor GSM-Tin for GSM and an intermediate stage transistor GSM-Tm for GSM that serve as a GSM driver stage (two stages) and an output stage transistor GSM-Tout for GSM serving as a GSM output stage. Then, the individual transistors are electrically connected to predetermined wiring lines by wire conductors. At an upper portion of the module substrate 200, an input terminal Pin(DCS) for DCS, a controller terminal Vctl, a power supply terminal Vdd and an output terminal Pout (DSC) are arranged. On the other hand, at a lower portion of the module substrate 200, an input terminal Pin(GSM) for GSM, a controller terminal Vapc for sensing weak electric waves to raise sensitivity, a power supply terminal Vdd and an output terminal Pout(GSM) are arranged. A chip resistor and a chip condenser are mounted as resistor R and capacitor C, respectively, by soldering for the reasons of impedance matching. Details of the circuit construction will be omitted. As the GSM (900 MHz), not less than 4 W can be expected and as the DCS (1800 MHz) output, not less than 2 W can be expected.

In the past, DD-CIMA (Divided Device and Collectively Impedance Matched Amplifier) has been adopted to realize high outputs of output stage transistor. In the construction of the DD-CIMA, two transistor chips are connected in parallel as disclosed in JP-A-2001-94094, for instance.

On the other hand, according to the present embodiment, the strained Si layer is used in the channel region as described in connection with embodiment 1 with a view to improving the mobility. Therefore, the employment of the DD-CIWA structure is unnecessary, so that the module substrate area can be decreased by 20 to 30% to permit miniaturization.

The embodiments according to the invention have been set forth so far. Their features will now be summarized as below.

(1) Structurally, the field-effect transistor (MOSFET) according to one embodiment of the invention has a semiconductor multi-layer structure in which a first SiGe layer having a first conductivity-type and relatively high impurity concentration, a second SiGe layer having the first conductivity type and relatively low impurity concentration and a Si layer having the first conductivity type and relatively low impurity concentration are sequentially formed on one major surface of a Si substrate having the first conductivity, wherein a gate electrode is formed above the major surface of the semiconductor multi-layer structure through a gate insulating film, a source region of a second conductivity type and a drain region of the second conductivity type are so formed in the second SiGe layer as to sandwich part of the second SiGe layer underlying the gate electrode and serving as a channel forming region, and a reach-through layer electrically connected to the source region is so formed as to pass through the second SiGe layer and reach the first SiGe layer.

(2) The previously-described high density crystal defect region is formed in only the interior of the Si substrate or the first SiGe layer, and the interface between the first and second SiGe layers and the defect region do not contact mutually.

(3) The first SiGe layer has a thickness of not less than 0.5 $\mu$m and not greater than 3.0 $\mu$m. This ensures that the defect region (less than 0.5 $\mu$m) concomitant with the generation of dislocation caused by forming the first SiGe layer on the Si substrate can be contained only inside the interior of the first SiGe layer and Si substrate as described previously.

(4) The second SiGe layer is set to have a thickness of not less than 0.5 $\mu$m and not greater than 2.5 $\mu$m, the first SiGe layer is set to have a peak value of impurity concentration of not less than $1\times10^{19}/cm^3$, and the second SiGe layer is set to have an impurity concentration of not greater than $1\times10^{17}/cm^3$ before the step of implanting impurities from above the major surface for the purpose of adjusting the threshold voltage. Through this, the distribution of electric fields between the first SiGe layer, which electrically contacts the source electrode and assumes the same potential as that at the source electrode as described previously, and the drain electrode can be uniformed. Consequently, drain leakage can be decreased.

(5) A drain offset region of the second conductivity type is provided in an intermediate region between the drain electrode region and gate electrode region in the major surface of the semiconductor multi-layer structure. By virtue of this, an electric field formed by the drain electrode and source electrode in a direction parallel to the channel can have a proper value.

Owing to the above features, a depletion layer region formed by the source and drain is generated only inside the second SiGe region and drain offset region, with the result that the electric fields in these portions can have proper values, and the first SiGe layer and Si substrate contain defects at high densities and can be at the same potential because of sufficiently high impurity concentration and electrical contact to the source electrode. This eliminates factors of performance degradation such as drain leakage current and parasitic capacitance and the effect of mobility increase due to the strained Si or SiGe can fulfill itself maximally.

(6) When, in the structure of the device, the first conductivity type is P-type, the second conductivity-type is N-type and the Si layer formed on the second SiGe layer is set to have a thickness of not less than 5 nm and not greater than 70 nm, an N-channel field-effect transistor having a channel formed in the Si can be obtained. When the first conductivity type is N-type, the second conductivity type is P-type and the Si layer formed on the second SiGe layer has a thickness of not less than 2 nm and below 5 nm, a P-channel field-effect transistor having a channel formed in the second SiGe can be obtained and with the thickness of the Si layer set to not less than 5 nm and not greater than 70 nm, a P-channel field-effect transistor having a channel formed in the Si can be obtained.

(7) When the aforementioned N-channel field-effect transistor and P-channel field-effect transistor are connected in series at the respective source electrodes or drain electrodes, a complementary amplification circuit can be constructed which can cancel non-linearity of drain current near thresholds of the respective transistors to thereby improve distortion characteristics of the amplification circuit.

(8) For the purpose of increasing the channel conductance as described previously, sufficient strain needs to be applied to the Si layer or for the purpose of increasing the mobility in the SiGe layer, the Ge content ratio in the second SiGe layer needs to be not less than 5%, preferably, about 30%. But in excess of 50%, the effect of the increased mobility is saturated and the crystalline quality is degraded to brings about a disadvantage breakdown voltage is decreased. Therefore, the aforementioned range of not less than 5% and not greater than 50% is preferable.

(9) In order to apply sufficient strain to the Si layer, the difference between a lattice constant (assumed to be a) in a plane parallel to the major surface of the second SiGe layer and a lattice constant (assumed to be b) of the bulk single crystalline Si is required to be not less than 70% and not greater than 100% of the difference between a lattice constant (assumed to be c) of the bulk single crystalline SiGe having the same Ge content ratio as that of the second SiGe layer and the lattice constant of the bulk single crystalline Si. This can be expressed by the following expression:

$$0.7 \leq (a-b)/(c-b) \leq 1.0$$

(10) As described above, in order to approximate the lattice constant of the second SiGe layer to that of the bulk single crystalline SiGe, the first SiGe needs to have a sufficient thickness as described in (4) above but more preferably, the Ge content of the first SiGe layer is also required to be increased along the film thickness direction from above the Si substrate. This is also effective to position the high-density defect layer present in the first SiGe layer in the proximity of the interface between the first SiGe layer and Si substrate, thereby making the high-density defect layer distant from the second SiGe layer.

(11) With a large thermal load imposed on a multi-layer structure of the first and second SiGe layers and the Si layer thereon, stain in the Si layer is relaxed concurrently with diffusion of Ge, leading to an undesirable result. Accordingly, for the device isolation region of field-effect transistor, a shallow groove device isolation method, that is, a method of forming grooves in the Si layer and second SiGe layer of the multi-layer structure, depositing an insulating material on the entire surface and flattening the deposited material by polishing is more suitable than the conventionally widespread local thermal oxidizing method.

Figure 11:
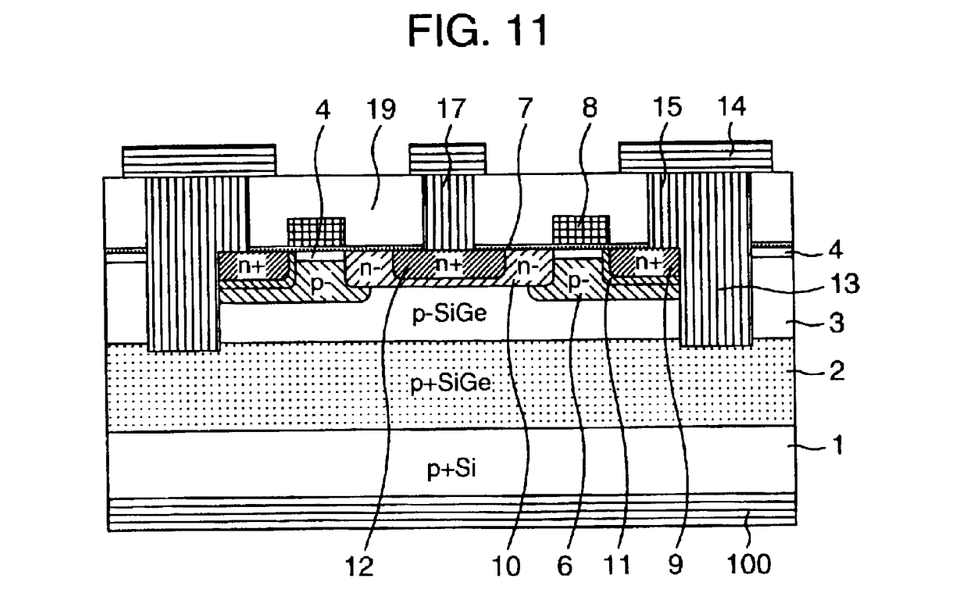
FIG. 11 is a longitudinal diagram showing another embodiment of the invention.

(12) It is necessary that the source electrode electrically contact the first SiGe layer of high impurity concentration or the substrate. In the case of the conventional Si field-effect transistor, ions are implanted at a high concentration to the contact region of the epitaxial Si layer of low impurity concentration that has grown on the Si substrate of high impurity concentration and a resulting structure is heat-treated at a high temperature for a long period to assure electrical contact to the Si substrate. In the case of the field-effect semiconductor device of the invention, an allowable thermal load is limited and such a method as above is not preferable. Then, in the contact region, either the second SiGe layer of low impurity concentration is removed or part or the whole of the first SiGe layer is removed in addition to the second SiGe layer and thereafter an electrically conductive material is deposited in this void to assure electrical contact between the source electrode and the substrate portion. For the ordinary field-effect transistor using Si, a method is available as disclosed in JP-A-4-196440, according to which high-resistance Si is removed until it reaches a low-resistance Si substrate and tungsten or polycrystalline Si is embedded. This known method, however, does not consider advantage/disadvantage depending on a material to be embedded. Contrarily, the transistor of the invention is greatly featured in that control of strain in the Si channel layer has a great influence upon the performance. Therefore, selection of a material used for embedding is of importance. It has been found that when polycrystalline Si is embedded, compressive strain is applied to the channel layer but when tungsten is deposited through CVD or when copper plated with a barrier metal layer of cobalt silicide or tungsten nitride is deposited, the channel layer is not affected adversely by virtue of plasticity of metal in contrast to the polycrystalline Si. Accordingly, metal or metal silicide may preferably be used as a material for source electrode grounding (reach-through). An embodiment in this point is shown in FIG. 11. Metal or metal silicide 13 is embedded in the second SiGe layer so as to be formed therein. This attains advantages that the series resistance of the source electrode can be reduced and at the same time, heat generated near the channel concomitantly with operation of the device can be bypassed to the substrate through the electrode wiring without being routed through the high resistance second SiGe layer of low heat conductivity, thus improving the heat dissipation effect.

(13) The grounded-source field-effect type transistor for high frequency power amplification has a structure in which a plurality of devices are connected in parallel. In this case, a plurality of drain electrodes are arranged in line, a plurality of gate electrodes are arranged in lines on both sides of the respective drain electrodes and a plurality of source electrodes are arranged in lines on both sides of the respective gate electrodes to form a set or a unit of electrodes. The plurality of sets are juxtaposed unit by unit. By providing the first SiGe layer or the exposed region of the substrate on the outer sides of the source electrode lines, it is possible to reduce the source grounding resistance. Further, by making the exposed region take a groove structure parallel to the source region, strain distribution can be obtained in which strain in the Si layer increases from the proximity of the source to the proximity of the drain in the channel region. As the strain increases, energy of the conduction band in the strained Si decreases. In other words, by taking the structure in which stain increases in a direction from the source to the drain, the lateral electric field in the channel is more intensified even under the application of the same drain voltage and the drain current increases. This accounts for the fact that positioning the groove on the outside of the source is a necessary method for promoting the performance of the transistor. The aforementioned selection of the source electrode grounding material meets this purpose.

(14) preferably, polycrystalline Si is used for the gate electrode from the standpoint of easiness of fabrication process (working process) and controllability of threshold voltage. For reduction of resistance of the gate electrode, providing a metal silicide layer above the polycrystalline Si is effective. But, the material of the gate electrode is not limited to this and for example, polycrystalline SiGe can be used in place of the polycrystalline Si or a method can be employed in which a dummy gate made of polycrystalline Si is formed, the dummy gate is subsequently removed to form a void and a metal is then embedded therein.

According to the foregoing embodiments of the invention, the power added efficiency of the field-effect type transistor for power amplification used for the mobile terminal can be improved remarkably.

It should be further understood by those skilled in the art that although the foregoing description has been made on embodiments of the invention, the invention is not limited thereto and various changes and modifications may be made without departing from the spirit of the invention and the scope of the appended claims.

What is claimed is:

1. A field-effect type semiconductor device for power amplification comprising a semiconductor multi-layer structure in which a first SiGe layer having a first conductivity-type and relatively high impurity concentration, a second SiGe layer having the first conductivity-type and relatively low impurity concentration and a Si layer having the first conductivity-type and relatively low impurity concentration are sequentially formed on one major surface of a Si substrate of the first conductivity type, wherein a gate electrode is formed on a major surface of said semiconductor multi-layer structure through a gate insulating film, a source region and a drain region each having a second conductivity-type are so formed in said second SiGe region as to sandwich part of the Si layer underlying said gate electrode and serving as a channel forming region, and a reach-through layer electrically connected to said source region is so formed as to pass through said second SiGe layer and reach said first SiGe layer.

2. A field-effect type semiconductor device for power amplification comprising a semiconductor multi-layer structure in which a first SiGe layer having a first conductivity-type and relatively high impurity concentration, a second SiGe layer having the first conductivity-type and relatively low impurity concentration and a Si layer having the first conductivity-type and a relatively low impurity concentration are sequentially formed on one major surface of a Si substrate of the first conductivity-type, wherein a gate electrode is formed on a major surface of said semiconductor multi-layer structure through an gate insulating film, a source region and a drain region each having a second conductivity-type are so formed in said second SiGe layer as to sandwich part of said second SiGe layer underlying said gate electrode and serving as a channel forming region, and a reach-through region electrically connected to said source region is so formed as to pass through said second SiGe layer and reach said first SiGe layer.

3. A field-effect type semiconductor device according to claim 1, further comprising a drain offset region of the second conductivity-type that adjoins said drain region in the major surface of said semiconductor multi-layer structure.

4. A field-effect type semiconductor device according to claim 1, wherein said first conductivity-type is P-type and said second conductivity-type is N-type.

5. A field-effect type semiconductor device according to claim 1, wherein said first conductivity-type is N-type and said second conductivity-type is P-type.

6. A field-effect type semiconductor device according to claim 1, wherein said first SiGe layer has a thickness of not less than 0.5 $\mu$m and not greater than 3.0 $\mu$m.

7. A field-effect type semiconductor device according to claim 1, wherein said second SiGe layer has a thickness of not less than 0.5 $\mu$m and not greater than 2.5 $\mu$m.

8. A field-effect type semiconductor device according to claim 1, wherein a difference between a lattice constant in a plane parallel to the major surface and positioned at an interface between said first and second SiGe layers and a lattice constant of a bulk single crystalline Si is not less than 70% and not greater than 100% of a difference between a lattice constant of a bulk single crystalline SiGe having the same Ge content as that of said second SiGe layer and the lattice constant of the bulk single crystalline Si.

9. A field-effect type semiconductor device according to claim 1, wherein a crystal defect region is formed in said Si substrate or said first SiGe layer, and an interface between said first and second SiGe layers and said defect region do not contact each other.

10. A field-effect type semiconductor device according to claim 1, wherein said second SiGe layer has a Ge content ratio of not less than 5% and not greater than 50% and an interface between said first and second SiGe layers has the same Ge content ratio as that of said second SiGe layer.

11. A field-effect type semiconductor device according to claim 1, wherein said first SiGe layer has a Ge content ratio that is small at an interface to said Si substrate and increases in a direction of film thickness.

12. A field-effect type semiconductor device according to claim 1, wherein said Si layer has a thickness of not less than 2 nm and not greater than 70 nm.

13. A field-effect type semiconductor device according to claim 1, wherein said first SiGe layer has a peak value of impurity concentration that is not less than $1\times10^{19}/cm^3$.

14. A field-effect type semiconductor device according to claim 1, further comprising a device isolation region formed by forming grooves in said multi-layer structure of Si and SiGe layers in the grooves.

15. A field-effect type semiconductor device according to claim 1, wherein electrical contact between a source electrode and said first SiGe layer of high impurity concentration or said substrate is made by removing part of the Si layer and second SiGe layer in a region near said source electrode to expose said first SiGe layer or said substrate and depositing metal or metal silicide.

16. A field-effect type semiconductor device according to claim 1, wherein said gate electrode includes a polycrystalline Si layer or polycrystalline SiGe layer and a metal silicide layer formed on said polycrystalline Si layer or polycrystalline SiGe layer.

* * * * *

UNITED STATES PATENT AND TRADEMARK OFFICE
CERTIFICATE OF CORRECTION

PATENT NO. : 6,815,707 B2
DATED : September 30, 2002
INVENTOR(S) : N. Sugii et al.

It is certified that error appears in the above-identified patent and that said Letters Patent is hereby corrected as shown below:

<u>Title page,</u>
Item [30], Foreign Application Priority Data, please add:
-- October 2, 2001     [JP] 2001-305929 --.

Signed and Sealed this

Third Day of May, 2005

JON W. DUDAS
*Director of the United States Patent and Trademark Office*